United States Patent [19]

Odom

[11] 3,909,730

[45] Sept. 30, 1975

[54] PULSE WIDTH DISCRIMINATOR

[75] Inventor: James T. Odom, Huntsville, Ala.

[73] Assignee: Avco Corporation, Huntsville, Ala.

[22] Filed: July 10, 1974

[21] Appl. No.: 487,216

[52] U.S. Cl. .................. 328/111; 307/234; 307/273

[51] Int. Cl.[2] .................. H03K 5/20

[58] Field of Search .................. 307/234, 265, 273; 328/111, 112

[56] References Cited

UNITED STATES PATENTS

| | | | |
|---|---|---|---|
| 3,219,838 | 11/1965 | Hurst | 307/234 |
| 3,577,014 | 5/1971 | Low | 307/265 |
| 3,772,535 | 11/1973 | Tuten | 307/273 |
| 3,822,385 | 7/1974 | Kayalioglu | 307/234 |

*Primary Examiner*—Stanley D. Miller, Jr.

*Attorney, Agent, or Firm*—Charles M. Hogan

[57] ABSTRACT

An input gate switches one terminal of a resistance-capacitance network between an "O" and "1" condition. A resistor in this network biases another gate arrangement in such manner that an input pulse of adequate width causes a threshold of that gating arrangement to be reached and a delayed output pulse of like width produced.

4 Claims, 8 Drawing Figures

PULSE WIDTH DISCRIMINATOR

BACKGROUND OF THE INVENTION

1. Field of the Invention

The invention is a pulse width discriminator or digital pulse filter which is of general utility in pulse transmission systems and of particular advantage as employed in a fire and burglary warning system of the general type shown in U.S. Pat. No. 3,634,824, Zinn and Bodin, issued Jan. 11, 1972, and entitled "Signaling System Utilizing Frequency and Frequency Durations for Signaling and Control Functions."

2. Description of the Prior Art

Prior art pulse width discriminators generally employ a ramp wave form generator of substantial complexity. The generation of a sawtooth wave form is initiated at the beginning of the pulse and terminated at its end. If the ramp voltage achieves a certain value then the pulse is at least of the required width and a control effect is produced which causes that pulse to be transmitted or passed along or regenerated. On the other hand, if the pulse is too narrow and therefore such that the ramp voltage does not achieve a predetermined minimum, then the pulse is filtered out. Another approach is to employ a counter, to initiate the counting action at the beginning of the pulse under consideration and to terminate such action at the trailing edge of said pulse. The achievement of a minimum count produces a control effect which will cause the pulse under consideration to be passed or regenerated. On the other hand, if the required minimum count is not achieved, then the pulse is not passed. The circuitry here under discussion uses a few simple elements to discriminate against pulses of width less than a predetermined minimum.

SUMMARY OF THE INVENTION

The preferred embodiment of the invention comprises a combination of elements which rejects pulses less than a predetermined width, depending on the resistance-capacitance time constant employed. The output pulses are delayed in time but are of the same width as the input or applied pulses.

One object of the invention is to provide a pulse width discriminator in which the width or duration of the output pulse is substantially the same as that of the input pulse.

Another object is to provide a pulse width discriminator which utilizes a minimum of power, does not require temperature compensation for circuit threshold voltages, and is usable over a wide range of operating voltages.

A further object of the invention is to provide a pulse discriminator using a relatively small number of components, one in which the recovery time is equal to the switching time of the last gate in the cascade arrangement.

BRIEF DESCRIPTION OF THE DRAWINGS

For a better understanding of the invention, together with other and further objects, advantages, and capabilities thereof, reference is made to the following description of the appended drawings, in which.

DETAILED DESCRIPTION OF THE INVENTION

Figure 1:
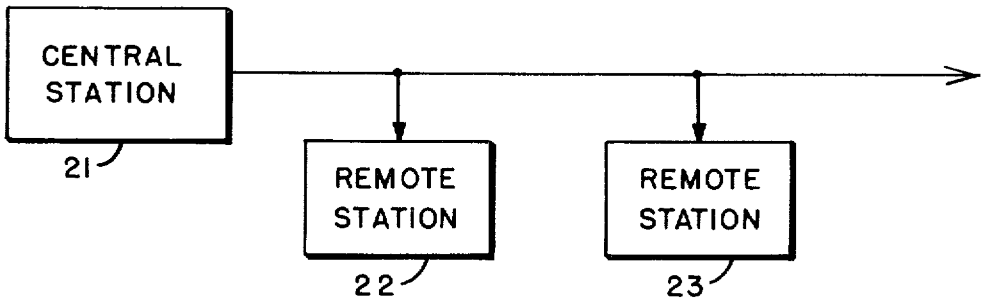
FIG. 1 is a generalized block diagram of a system in which the invention has utility.

The invention (FIG. 2) is made up of gates 11, 12 and 13 of a complementary symmetry/metal-oxide-semiconductor integration, a resistance-capacitance timing network comprising capacitor 14 and resistor 15, and two diodes 16 and 17. The pulse input to the network is the input line 18 of gate 11. The output of gate 11 is coupled through line 25 and resistor 15 and line 24 to the input of gate 12 and the output of gate 12 is coupled by line 19 to the input of gate 13. The output of gate 13 is coupled via line 20 and capacitor 14 to line 24. A positive clamping diode 17 is disposed between the input 24 of gate 12 and ground and a negative clamping diode 16 is disposed between said input and the positive terminal Vcc of a source of current (not shown).

This invention is used, for example, in a central station security system (FIG. 1) that uses telephone lines for communication between a central station 21 and remote stations such as those numbered 22 and 23. Prior to the invention it was found that in systems of this kind transients on the telephone lines cause undesired spurious pulses. The invention is typically used in order to filter out such undesired pulses.

Figure 2:
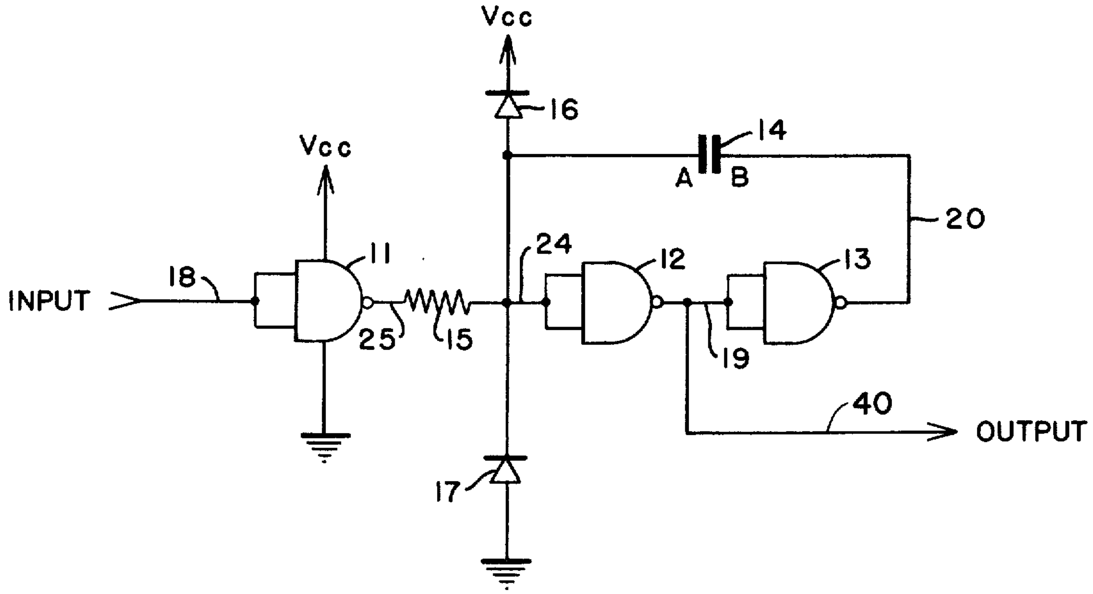
FIG. 2 is a schematic diagram of a preferred form of pulse width discriminator in accordance with the invention.
Figure 3:
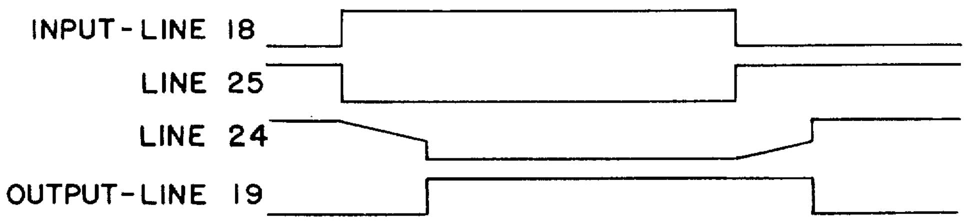
FIGS. 3 and 4 are sets of wave forms used in explaining the operation of the FIG. 2 embodiment.

Referring to FIGS. 2 and 3, the input on line 18 is applied to both inputs of gate 11, a two input NAND gate. The output of gate 11 goes, via line 25 and resistor 15 and line 24, to the input of gate 12, also a two input NAND gate. The cathode of diode 17 is connected to line 24 as is also the anode of diode 16. An output of gate 12 which is line 19, is connected to both inputs of gate 13. The output of gate 13, which is line 20, is connected to terminal B of capacitor 14. Terminal A of capacitor 14 is connected to input 24.

Assuming that line 18 is initially at a logic 0, line 25 will be at a logic 1, line 24 will be at a logic 1, line 19 will be at a logic 0, and line 20 will be at a logic 1, where a logic of 0 is equal to 0 volts and a logic 1 is equal to Vcc. The voltage on each of terminals A and B of capacitor 14 is at a potential equal to *Vcc*, giving zero potential across capacitor 14. When line 18 is set to a logic 1, line 25 goes immediately to a logic 0. (See FIG. 3). This enables the potential on terminal A of capacitor 14 to decrease or change toward 0 volts at a rate determined by the values of resistor 15 and capacitor 14. When line 24 reaches a potential of approximately 0.5 *Vcc*, line 19 will switch to a 1, causing line 20 to switch to a 0. This causes terminals A and B of capacitor 14 to immediately go to 0 volts, giving 0 potential across capacitor 14. This results in a recovery time equal to the switching time of gate 13 connected in this configuration. When the input on line 18 returns to a 0, line 25 immediately switches to a 1 and the potential at terminal A of capacitor 14 begins to increase or change toward *Vcc*. When line 24 reaches approximately 0.5Vcc, line 19 switches to a 0, causing line 20 to switch to a 1. This 1 at terminal B of capacitor 14 causes terminal A of capacitor 14 to go to a 1. Diodes 16 and 17 are used to clamp line 24 so that it remains between Vcc and 0 volts.

Figure 4:
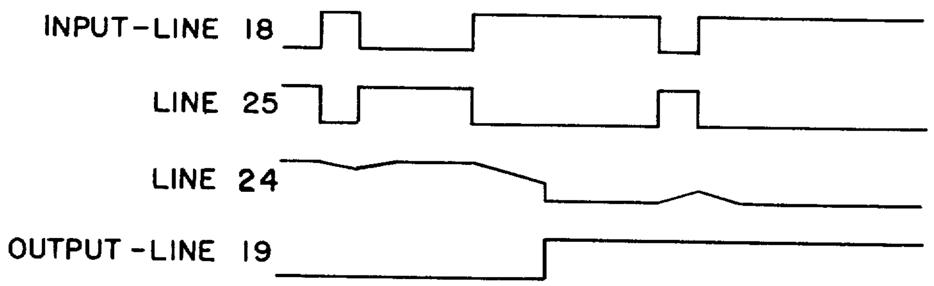

In the above description, if the width of the input pulse was less than the predetermined desired width (P), then line 24 will never reach 0.5 Vcc where switching of line 19 to a 1 occurs. This condition is shown in FIG. 4. A pulse of short width is applied to line 18. Line 25 immediately goes to a 0 and the potential on terminal A of 14 decreases. However before line 24 reaches 0.5 Vcc, line 18 returns to a logical 0, switching line 25 to a 1, restoring both sides of capacitor 14 to a 1.

Figure 7:
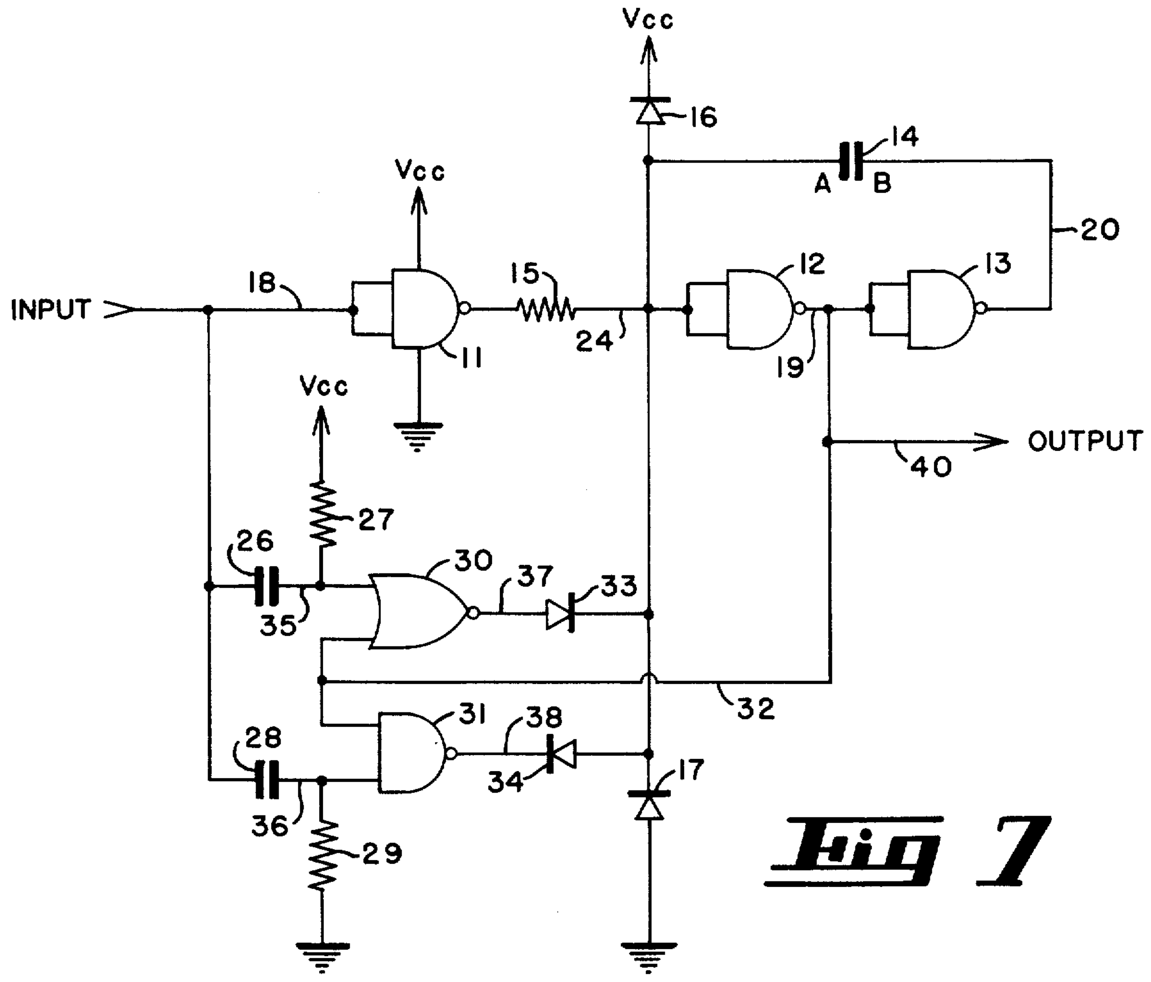
Figure 8:
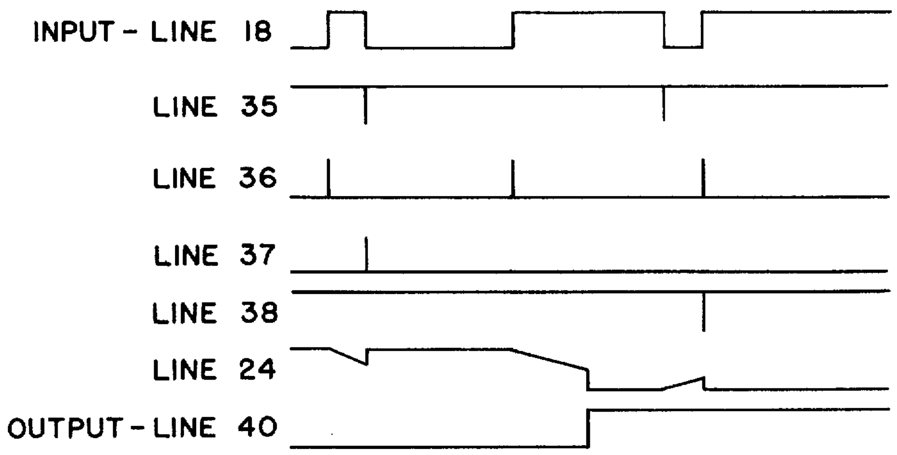
FIG. 8 is a set of curves used in explaining the operation of the FIG. 7 embodiment.

In FIG. 7 there is shown a modified form of the invention in which recovery is immediate. Between the input line 18 and terminal Vcc is connected in series a resistance-capacitance differentiator network comprising capacitor 26 and resistor 27. Between line 18 and ground there is connected another differentiating network comprising capacitor 28 and resistor 29. These differentiating networks supply inputs to OR circuit (inverted output gate) 30 and AND gate (inverted output) 31. The remaining inputs to these two gates are supplied from line 19 via line 32. The operation is such that, in response to the downward transition in the voltage of an excessively short pulse and the existence of an 0 on line 19, then gate 30, acting via diode 33, in series between the output of gate 30 and line 24, drives terminal A of resistor 14 toward a 1 condition, restoring the static posture of capacitor 14.

On the other hand, a positive transition of the applied pulse accompanied by a 1 condition of line 19 causes gate 31, acting via diode 34, to drive line 24 and terminal A toward a 0 condition.

Figure 5:
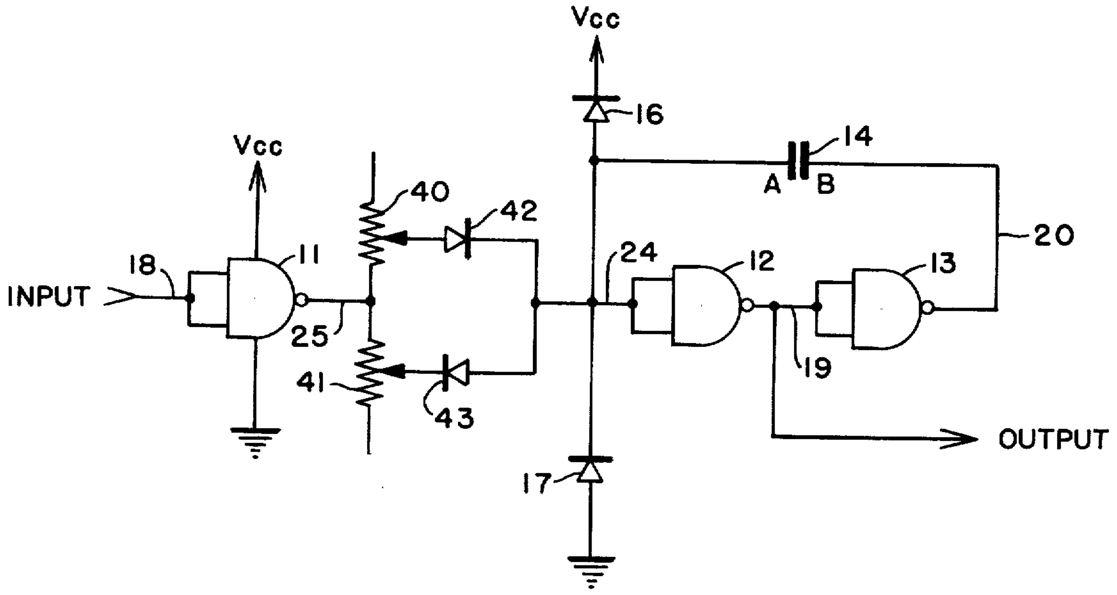
FIGS. 5, 6 and 7 are modified forms of pulse width discriminators in accordance with the invention.

The circuit illustrated in FIG. 2, the preferred embodiment, introduces some error. This is because the switch over point of gate 12 is not exactly 0.5 Vcc. In FIG. 5 there is shown an embodiment of the invention in which an error of this kind can be compensated for. In lieu of resistor 15 there are provided resistors 40 and 41 having a junction at 25. Adjustably positioned contacts are separately in series between these resistors and line 24, via paths provided by diodes 42 and 43.

Figure 6:
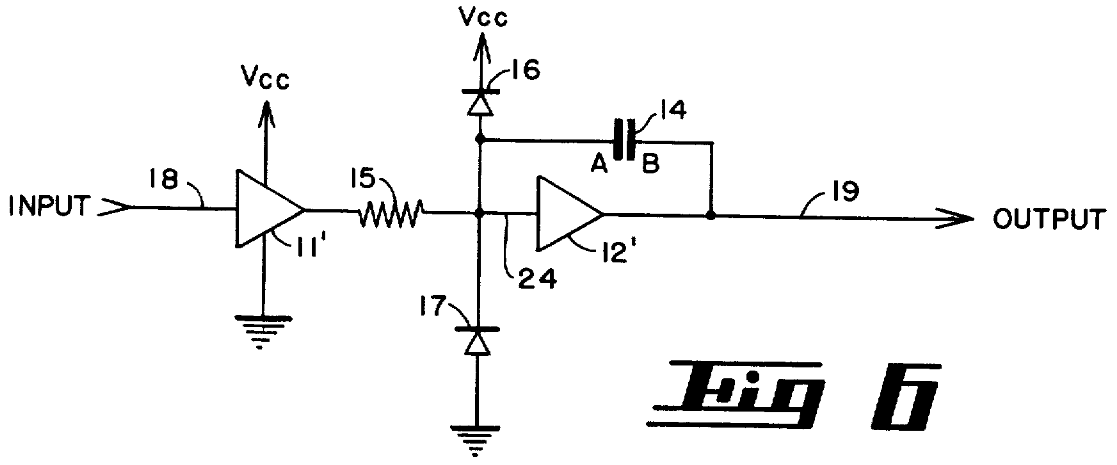

As shown in FIG. 6, the invention can be adapted to the use of non-inverting gates 11' and 12'.

The following circuit parameters have been found to be satisfactory in various working embodiments of the invention:

| | |
|---|---|
| Resistor 15 | 22,000 ohms |
| Capacitor 14 | 0.1 microfarad |
| Diode 16 | Type 1N914 |
| Diode 17 | Type 1N914 |
| Gates 11, 12, 13 | Part of a Type 4011, such as the RCA Type CD 4011 AE |

In the FIG. 6 embodiment the gates 11' and 12' were parts of a 4050, RCA type CD 4050 AE.

Vcc was 12 volts positive and the duration of the slope in FIG. 3 was 15 microseconds.

The invention provides:

a pulse width discriminator circuit comprising the following, in combination:

a junction (at 24), a point of reference potential (ground) representing the condition 0, a source of energy (having terminal Vcc) providing a point of charging potential representative of the condition 1, a positive clamping diode 17 between the 0 reference point and said junction, a negative clamping diode 16 between the charging potential point and said junction, a time constant circuit comprising capacitor 14 and resistor 15 elements connected in series at said junction, each element having an end terminal, a gate 11 having an input 18 to which a received pulse to be tested is applied and an output 25 connected to the end terminal of said resistor, said gate responding to the leading edge transition of said input pulse to switch said gate output 25 and said end terminal of said resistor from a 1 to an 0 condition, whereupon said time constant circuit begins to charge up and the voltage at said junction (at 24) falls, switchable means 12 having a pulse output 19 and an output 13, 20 coupled to the end terminal B of said capacitor 14, said switchable means normally maintaining a 1 condition on said end terminal of said capacitor, said switchable means changing state to provide a delayed output pulse (FIG. 3, line 19) of the same polarity as the received input pulse (FIG. 2, line 18) in the event that the voltage across said resistor 15 drops to the change of state threshold of said switchable means 12 characterized by a decreasing voltage, so that switching of the switchable means to provide an output pulse occurs only if at least a predetermined time elapses between said leading edge of said input pulse and the reverse transition at the end of said input pulse, an excessively short input pulse (first in FIG. 4) being rejected in that said switching does not occur, a pulse of the desired width being accepted in that said switching action does occur and is followed by a response of said gating means to the lagging edge of said input pulse (FIG. 3, line 24), switching said end terminal of said resistor back to a 1 condition so that said capacitor discharges and the voltage across said resistor increases to the threshold of said switchable means appropriate to switch it back to its original state.

In the above specification the same reference numerals designate elements performing like functions. Primed numerals designate analogous elements.

While there has been shown and described what is at present considered to be the preferred embodiments of the invention, various modifications and changes may be made therein without departing from the proper scope as defined by the appended claims.

Having described my invention, I claim:

1. A pulse width discriminator circuit comprising the following, in combination:

a junction, a point of reference potential representing the condition 0, a source of energy providing a point of charging potential representative of the condition 1, a positive clamping diode between the 0 reference point and said junction, a negative clamping diode between the charging potential point and said junction, a time constant circuit comprising capacitor and resistor elements each having a first end terminal connected to said junction, each element having also a second end terminal, a gate having an input to which a received pulse to be tested is applied and an output connected to the second end terminal of said resistor, said gate responding to the leading edge transition of said received pulse to switch said gate output and second terminal of said resistor from a 1 to an 0 condition, whereupon said time constant circuit begins to charge up and the voltage at said junction falls, switchable means comprising a pair of inverted gates in series and having an input connected to said junction and a pulse output and an output coupled to the second end terminal of said capacitor, said switchable means normally maintaining a 1 condition on said second end terminal of said capacitor, said switchable means changing state to provide a delayed output pulse of the same polarity as the received pulse in the event that the voltage across said resistor drops to the change of state threshold of said switchable means characterized by a decreasing voltage, so that switching of the switchable means to provide an output pulse occurs only if at least a predetermined time elapses between said leading edge of said received pulse and the reverse transition at the end of said received pulse, an excessively short received pulse being rejected in that said switching does not occur, a pulse of the desired width being accepted in that said switching action does occur and is followed by a response of said gate to the lagging edge of said input pulse, switching said second end terminal of said resistor back to a 1 condition so that said capacitor discharges and the voltage across said resistor increases to the threshold of said switchable means appropriate to switch it back to its original state.

2. The combination in accordance with claim 1 together with a balanced rheostat having a center point connected to the output of said gate, said rheostat having two adjustable contacts, a diode of one polarity between one of said contacts and said junction and a diode of the opposite polarity between the other contact and said junction.

3. A pulse width discriminator circuit comprising the following, in combination:

a junction, a point of reference potential representing the condition 0, a source of energy providing a point of charging potential representative of the condition 1, a positive clamping diode between the 0 reference point and said junction, a negative clamping diode between the charging potential point and said junction, a time constant circuit comprising capacitor and resistor elements each having a first end terminal connected to said junction, each element having also a second end terminal, a gate having an input to which a received pulse to be tested is applied and an output connected to the second end terminal of said resistor, said gate responding to the leading edge transition of said received pulse to switch said gate output and said end terminal of said resistor from a 1 to an 0 condition, whereupon said time constant circuit begins to charge up and the voltage at said junction falls, switchable means comprising a series combination of interconnected dual-input-terminal NAND gates having a pulse output and a final output coupled to the second end terminal of said capacitor, said switchable means normally maintaining a 1 condition on said second end terminal of said capacitor, said switchable means changing state to provide a delayed output pulse of the same polarity as the received pulse in the event that the voltage across said resistor drops to the change of state threshold of said switchable means characterized by a decreasing voltage, so that switching of the switchable means to provide an output pulse occurs only if at least a predetermined time elapses between said leading edge of said received pulse and the reverse transition at the end of said received pulse, an excessively short received pulse being rejected in that said switching does not occur, a pulse of the desired width being accepted in that said switching action does occur and is followed by a response of said gate to the lagging edge of said input pulse, switching said second end terminal of said resistor back to a 1 condition so that said capacitor discharges and the voltage across said resistor increases to the threshold of said switchable means appropriate to switch it back to its original state, and a first means including a first differentiating circuit disposed between the received source input and said source of energy for applying to said junction a positive going spike coincident with the ascending transition of a short input pulse, and a second means including a second differentiating circuit disposed between said received pulse input and said source of reference potential for applying to said junction a negative spike coincident in time with the descending transition of said short input pulse, said first and second means further including an inverted output AND gate and an inverted output OR gate respectively coupled between the first and second differentiating circuits and said junction to provide gating, said AND and OR gates having inputs to the received pulse input.

4. A pulse width discriminator circuit comprising the following, in combination:

a junction, a point of reference potential representing the condition 0, a source of energy providing a point of charging potential representative of the condition 1, a positive clamping diode between the 0 reference point and said junction, a time constant circuit comprising capacitor and resistor elements each having a first end terminal connected to said junction, each element have also a second end terminal, a gate having an input to which a received pulse to be tested is applied and an output connected to the second end terminal of said resistor, said gate responding to the leading edge transition of said received pulse to switch said gate output and second terminal of said resistor from a 1 to an 0 condition, whereupon said time constant circuit begins to charge up and the voltage at said junction falls, switchable means having an input connected to said junction and a pulse output and an output coupled to the second end terminal of said capacitor, said switchable means normally maintaining a 1 condition on said second end terminal of said capacitor, said switchable means changing state to provide a delayed output pulse of the same polarity as the received pulse in the event that the voltage across said resistor drops to the change of state threshold of said switchable means characterized by a decreasing voltage, so that switching of the switchable means to provide an output pulse occurs only if at least a predetermined time elapses between said leading edge of said received pulse and the reverse transition at the end of said received pulse, an excessively short received pulse being rejected in that said switch does not occur, a pulse of the desired width being accepted in that said switching action does occur and is followed by a response of said gate to the lagging edge of said input pulse, switching said second end terminal of said resistor back to a 1 condition so that said capacitor discharges and the voltage across said resistor increases to the threshold of said switchable means appropriate to switch it back to its original state.

* * * * *